(12) United States Patent
Horng et al.

(10) Patent No.: US 7,334,988 B2
(45) Date of Patent: *Feb. 26, 2008

(54) AIRFLOW GUIDING STRUCTURE VARYING IN INCLINATIONS OF AIR-GUIDING RINGS FOR A HEAT-DISSIPATING FAN

(75) Inventors: Alex Horng, Kaohsiung (TW); Ying-Rong Hong, Kaohsiung (TW); Ching-Sheng Hong, Kaohsiung (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 198 days.

This patent is subject to a terminal disclaimer.

(21) Appl. No.: 11/108,681

(22) Filed: Apr. 19, 2005

(65) Prior Publication Data

US 2005/0191955 A1    Sep. 1, 2005

Related U.S. Application Data

(63) Continuation-in-part of application No. 10/642,636, filed on Aug. 19, 2003, now Pat. No. 6,910,862.

(51) Int. Cl.
*F04D 29/54* (2006.01)

(52) U.S. Cl. .................................. 415/211.2

(58) Field of Classification Search ............ 415/208.2, 415/211.1, 211.2, 220, 221
See application file for complete search history.

(56) References Cited

U.S. PATENT DOCUMENTS

| | | | |
|---|---|---|---|
| 2,653,757 A | | 9/1953 | Segalman |
| 3,531,221 A | * | 9/1970 | Herberg et al. ............. 417/354 |
| 4,724,747 A | * | 2/1988 | Sturm et al. ............... 454/184 |
| 4,918,289 A | * | 4/1990 | Ohlsen et al. .............. 392/379 |
| 6,017,191 A | | 1/2000 | Harmsen |
| 6,398,492 B1 | | 6/2002 | Cho et al. |
| 6,601,546 B1 | | 8/2003 | Mohr et al. |
| 6,722,418 B2 | | 4/2004 | Zhang |

* cited by examiner

*Primary Examiner*—Ninh H. Nguyen
(74) *Attorney, Agent, or Firm*—Bacon & Thomas, PLLC (57) ABSTRACT

A heat-dissipating fan includes a casing having an air outlet, a base mounted in the air outlet, an impeller being mounted on the base and having a plurality of blades, a plurality of ribs each extending between the base and the casing along a radial direction of the base, and at least two air-guiding ring fixedly mounted to the ribs. The air-guiding rings vary in inclinations along a longitudinal direction of the casing. The air-guiding ring guides airflow in various directions, and divides airflow passing through the air outlet when the impeller is turning.

10 Claims, 10 Drawing Sheets

AIRFLOW GUIDING STRUCTURE VARYING IN INCLINATIONS OF AIR-GUIDING RINGS FOR A HEAT-DISSIPATING FAN

CROSS REFERENCE TO RELATED APPLICATION

This application is a continuation-in-part application of U.S. patent Ser. No. 10/642,636, filed on Aug. 19, 2003 now U.S. Pat. No. 6,910,862.

BACKGROUND OF THE INVENTION

1. Field of the Invention

The present invention relates to an airflow guiding structure for a heat-dissipating fan. In particular, the present invention relates to the airflow guiding structure varying in inclinations of air-guiding rings for the heat-dissipating fan.

2. Description of Related Art

Figure 1:
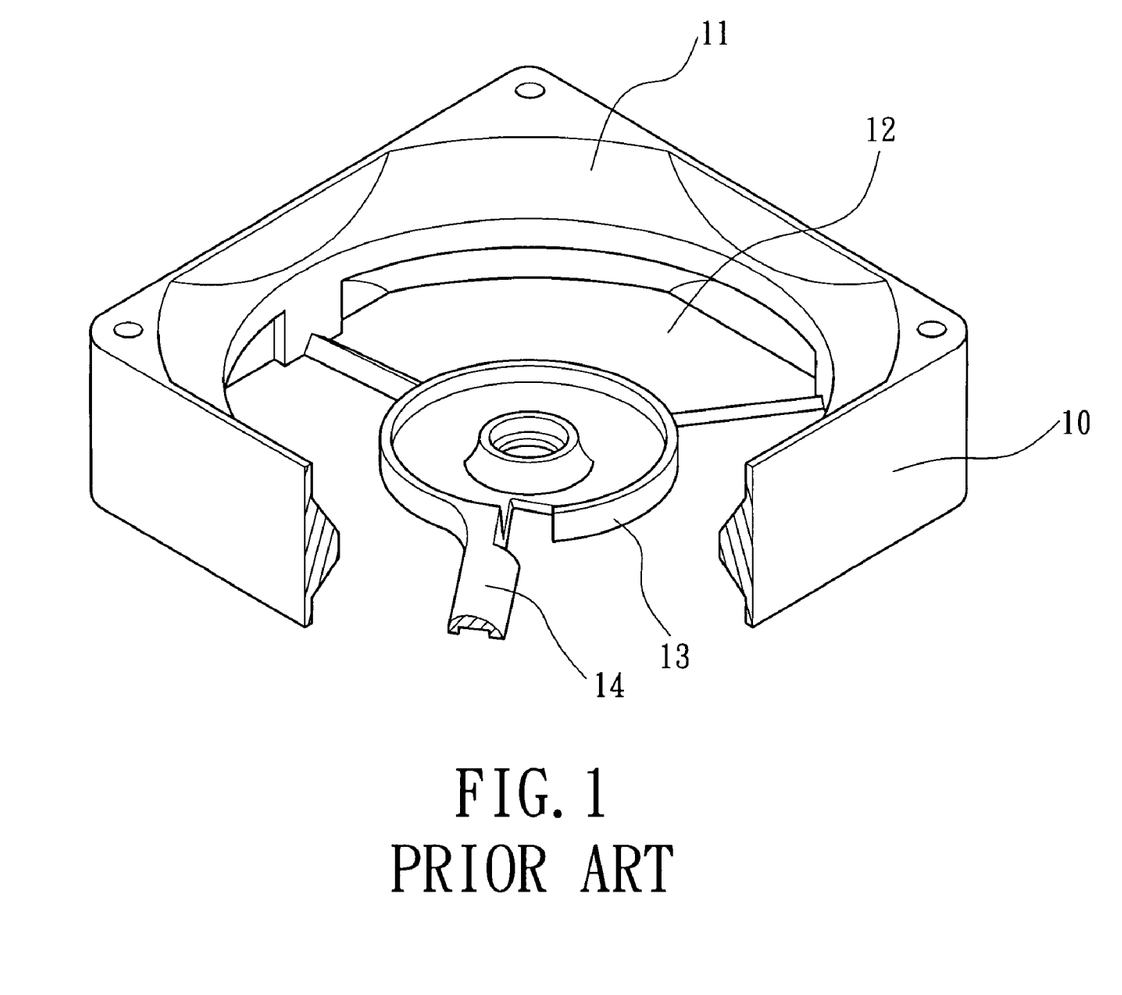
FIG. 1 is a perspective view, partly cutaway, of a conventional heat-dissipating fan.

FIG. 1 of the drawings illustrates a typical heat-dissipating fan including a casing 10, an air inlet 11 defined in a side of the casing 10, an air outlet 12 defined in the other side of the casing 10, a base 13, and a plurality of ribs 14. The ribs 14 connect between the casing 10 and the base 13 proximate to the air outlet 12. A stator (not shown) and an impeller (not shown) are commonly mounted to the base 13. When the impeller turns, driven air enters the casing 10 via the air inlet 11 and then exhausts the casing 10 via the air outlet 12 to dissipate heat generated from an object such as a heat sink or a central processing unit.

Although the above-mentioned heat-dissipating fan provides a certain heat-dissipating effect, the heat-dissipating operation can only be performed on an object directly below the air outlet 12, as the airflow can only flow along an axial direction of the casing 10. In a case that the object is not located directly below the air outlet 12, the airflow cannot flow through the object in a uniform manner, resulting in non-uniform heat dissipation and poor heat-dissipating effect. On the other hand, since the object is generally disposed within a limited space such as in a notebook type computer (or a laptop computer) in a position not directly below the base 13 or outside the area of air outlet, the heat-dissipating effect is adversely affected. The heat-dissipating effect is also adversely affected if the object is too large to be completely within an area directly below the heat-dissipating fan. Further, turbulence tends to occur when the airflow is passing through the ribs 14. Noise is thus generated while having a lower heat-dissipating effect.

OBJECTS OF THE INVENTION

An object of the present invention is to provide an air-guiding structure varying in inclinations of air-guiding rings for a heat-dissipating fan that includes at least two air-guiding rings in an air outlet of the heat-dissipating fan for concentrating and guiding airflow, increasing wind pressure, reducing wind noise, and improving the overall heat-dissipating efficiency.

Another object of the present invention is to provide an air-guiding structure varying in inclinations of air-guiding rings for a heat-dissipating fan that includes at least two air-guiding rings in an air outlet of the heat-dissipating fan. The air-guiding rings are co-axially arranged relative to a longitudinal direction of the casing, thereby concentrating and guiding airflow, increasing wind pressure, reducing wind noise, and improving the overall heat-dissipating efficiency.

A further object of the present invention is to provide an air-guiding structure varying in inclinations of air-guiding rings for a heat-dissipating fan that includes at least two air-guiding rings in an air outlet of the heat-dissipating fan. Each inclination angle of the air-guiding ring is selected to guide airflow to a desired area for concentrated heat dissipation or for enlarging the heat-dissipating area, thereby improving the overall heat-dissipating efficiency and making the assembly and design of the heat-dissipating fan more flexible.

SUMMARY OF THE INVENTION

In accordance with a first aspect of the invention, a heat-dissipating fan includes a casing having an air outlet, a base mounted in the air outlet, an impeller being mounted on the base and having a plurality of blades, a plurality of ribs each extending between the base and the casing along a radial direction of the base, and at least two air-guiding rings fixedly mounted to the ribs. The air-guiding ring has an axial length that is greater than a radial width of the air-guiding ring in the radial direction. The air-guiding ring guides and divides airflow passing through the air outlet when the impeller is turning.

In an embodiment of the invention, at least one of the air-guiding rings extends in an inclination relative to a longitudinal direction of the casing. In another embodiment of the invention, at least one of the air-guiding rings extends downward and radially outward. In a further embodiment of the invention, at least one of the air-guiding rings extends downward and radially inward.

In still another embodiment of the invention, at least one of the air-guiding rings includes an annular inner face extending downward and radially inward and an annular outer face extending downward and radially outward. The air-guiding ring has a triangular section, with the annular inner face and the annular outer face connecting each other at a common annular ridge.

The ribs may incline along an air-driving direction of the blades of the impeller. Each rib has two rib sections arranged along the air-guiding ring, with the rib sections having different inclination angles. The air-guiding ring may include a rounded guiding portion in a top thereof adjacent to an air inlet side of the casing.

In accordance with a second aspect of the invention, a heat-dissipating fan includes a casing having an air outlet, a base mounted in the air outlet, an impeller being mounted on the base and having a plurality of blades, a plurality of ribs each extending between the base and the casing along a radial direction of the base, a first air-guiding ring fixedly mounted to the ribs and located between the base and the casing, and a second air-guiding ring fixedly mounted to the ribs and located between the first air-guiding ring and the casing. The first air-guiding ring and the second air-guiding ring commonly guide and divide airflow passing through the air outlet when the impeller is turning.

Preferably, each of the first air-guiding ring and the second air-guiding ring has an axial length and a width in the radial direction, with the axial length being greater than the radial width.

In an embodiment of the invention, the first air-guiding ring extends downward and radially outward and the second air-guiding ring extends downward and radially inward. In another embodiment of the invention, the first air-guiding ring extends downward and radially inward and the second guiding ring extends downward and radially outward.

In a further embodiment of the invention, the first air-guiding ring includes an annular inner face extending downward and radially inward and an annular outer face extending downward and radially outward, and the second air-guiding ring includes an annular inner face extending downward and radially inward and an annular outer face extending downward and radially outward. Each of the first air-guiding ring and the second air-guiding ring has a triangular section, with the annular inner face and the annular outer face of the first air-guiding ring connecting each other at a common annular ridge, and with the annular inner face and the annular outer face of the second air-guiding ring connecting each other at another common annular ridge.

Other objects, advantages and novel features of this invention will become more apparent from the following detailed description when taken in conjunction with the accompanying drawings.

DETAILED DESCRIPTION OF THE PREFERRED EMBODIMENTS

Preferred embodiments of the present invention are now to be described hereinafter in detail, in which the same reference numerals are used in the preferred embodiments for the same parts as those in the prior art to avoid redundant description.

Figure 2:
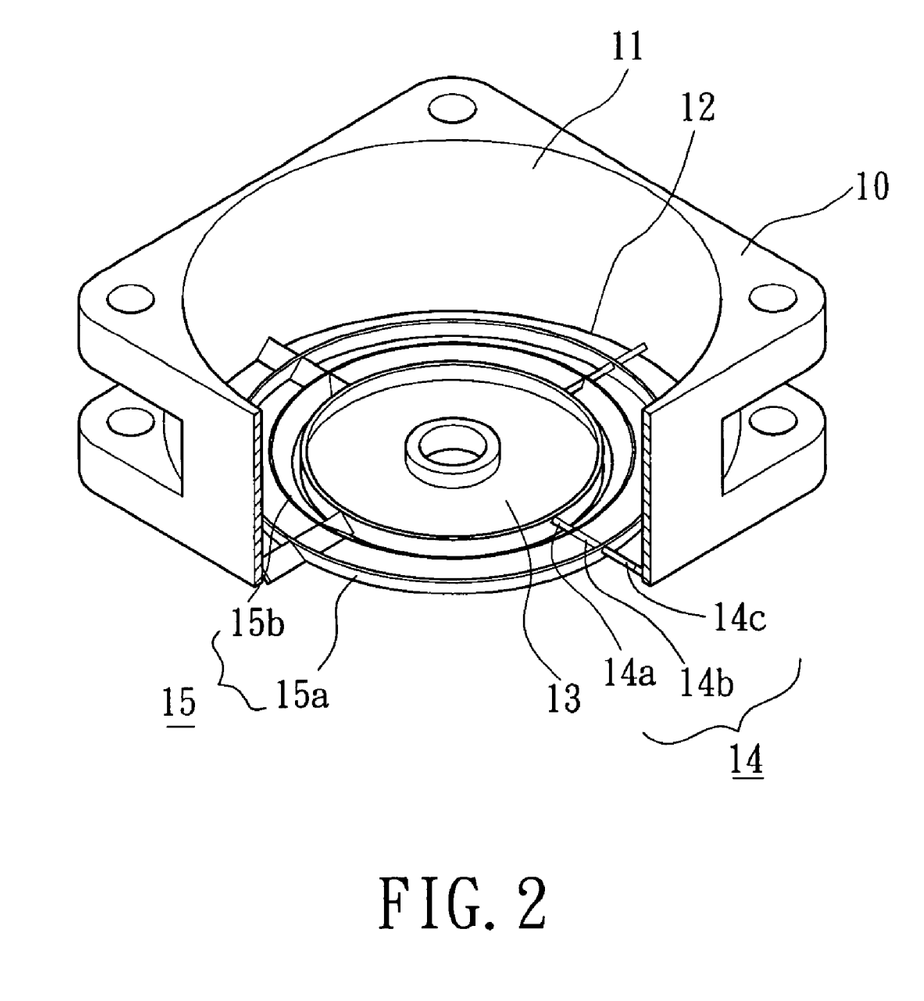
FIG. 2 is a perspective view, partly cutaway, of a heat-dissipating fan with a first embodiment of an airflow guiding structure varying in inclinations of air-guiding rings in accordance with the present invention.
Figure 3:
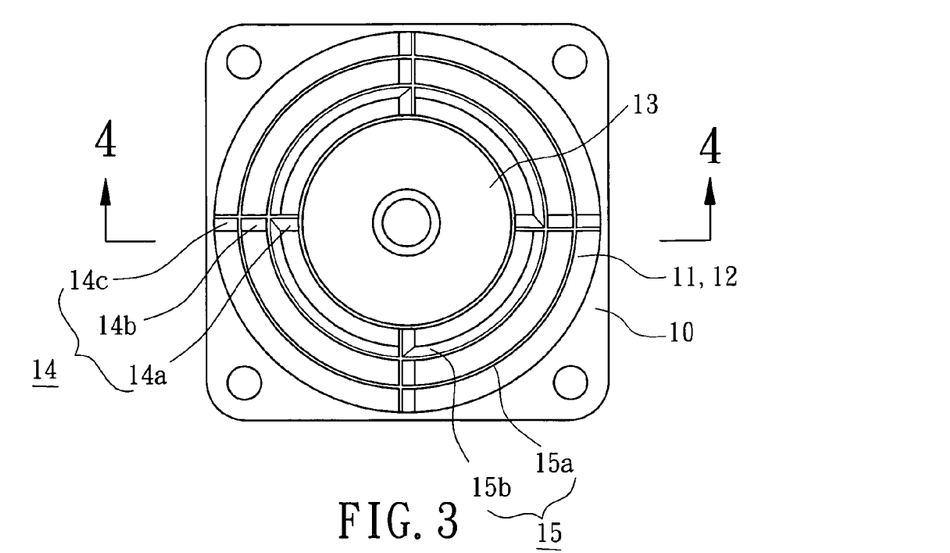
FIG. 3 is a top view of the heat-dissipating fan in FIG. 2.
Figure 4:
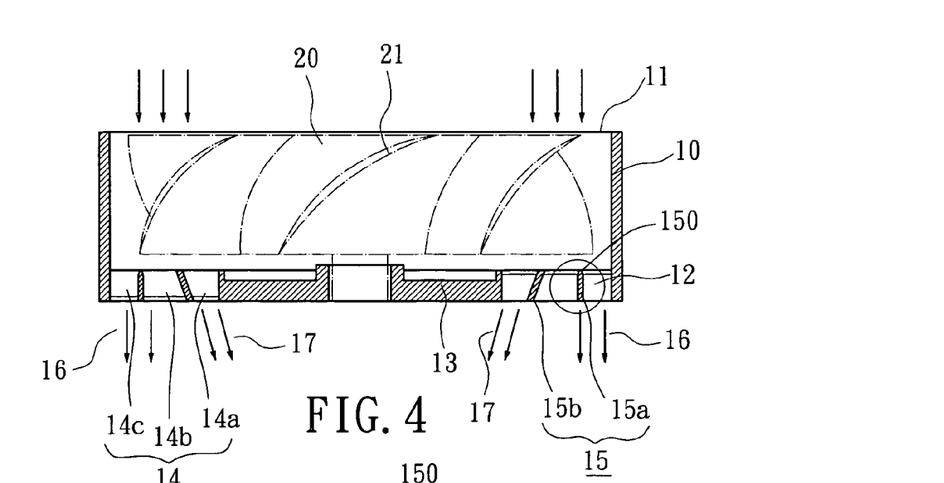
FIG. 4 is a sectional view taken along line 4-4 in FIG. 3.
Figure 4A:
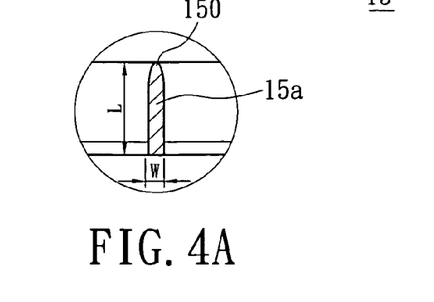
FIG. 4A is an enlarged view of a circled portion of FIG. 4.

Referring to FIGS. 2, 3, 4, and 4A, a heat-dissipating fan with a first embodiment of an airflow guiding structure in accordance with the present invention includes a casing 10, an air inlet 11, an air outlet 12, a base 13, a plurality of ribs 14, and at least two air-guiding rings 15a, 15b. The casing 10 may be made of plastics or metal, with the air inlet 11 and the air outlet 12 being respectively defined in two opposite sides of the casing 10. The base 13 is located in the air outlet 12, and an impeller 20 (in FIG. 4) is mounted on the base 13. The ribs 14 extend between the base 13 and the casing 10 along a radial direction of the base 13. The air-guiding rings 15a, 15b are co-axially arranged and located between the base 13 and the casing 10 (in FIG. 4) and extend along a longitudinal direction of the casing 10. The air-guiding ring 15a is parallel to an annular wall of the casing 10 while the air-guiding ring 15b inclines to the base 13 along a longitudinal direction of the casing 10, as best shown in FIG. 4, namely the air-guiding ring 15b has an inclination to the air-guiding ring 15a. Further, each of the air-guiding rings 15 extends across the ribs 14 and is fixedly mounted to the ribs 14. As illustrated in FIG. 4A, the air-guiding rings 15a has an axial length L that is preferably greater than its radial width W in the radial direction of the casing 10. Further, the air-guiding ring 15a has a rounded guiding portion 150 in a top end thereof adjacent to the air inlet side of the casing 10, thereby reducing turbulence. Further, the ribs 14 may incline along an air-driving direction of a plurality of blades 21 of the impeller 20.

Still referring to FIG. 4, when the impeller turns 20, the blades 21 of the impeller 20 introduce airflow into the casing 10 via the air inlet 11 and expel the airflow via the air outlet 12, thereby dissipating heat from an object such as a heat sink or central processing unit (not shown). When the airflow passes through the air-guiding ring 15a and the ribs 14, the air-guiding ring 15a divides the airflow into an inner portion 17 that is guided toward a center of the air outlet 12 and an outer portion 16 that is guided flows through an outer section of the air outlet 12 between the ribs 14 and the casing 10. Thus, the heat-dissipating fan provides a reliable concentrated heat-dissipating effect within a specific area. Also, the heat-dissipating fan is suitable for installing within a limited space (e.g., in a notebook type computer or laptop computer), as the airflow can be guided to an object in a position not directly below the air outlet 12. Thus, the air-guiding rings 15a, 15b provides an air-guiding effect.

Further, as illustrated in FIGS. 2 and 3, the ribs 14 also provide an air-guiding effect when the ribs 14 incline along an air-driving direction of a plurality of blades 21 of the impeller 20. Meanwhile, the rib sections 14a, 14b and 14c of the ribs 14 separated by the air-guiding rings 15a, 15b may have different inclination angles according to the need.

Figure 5:
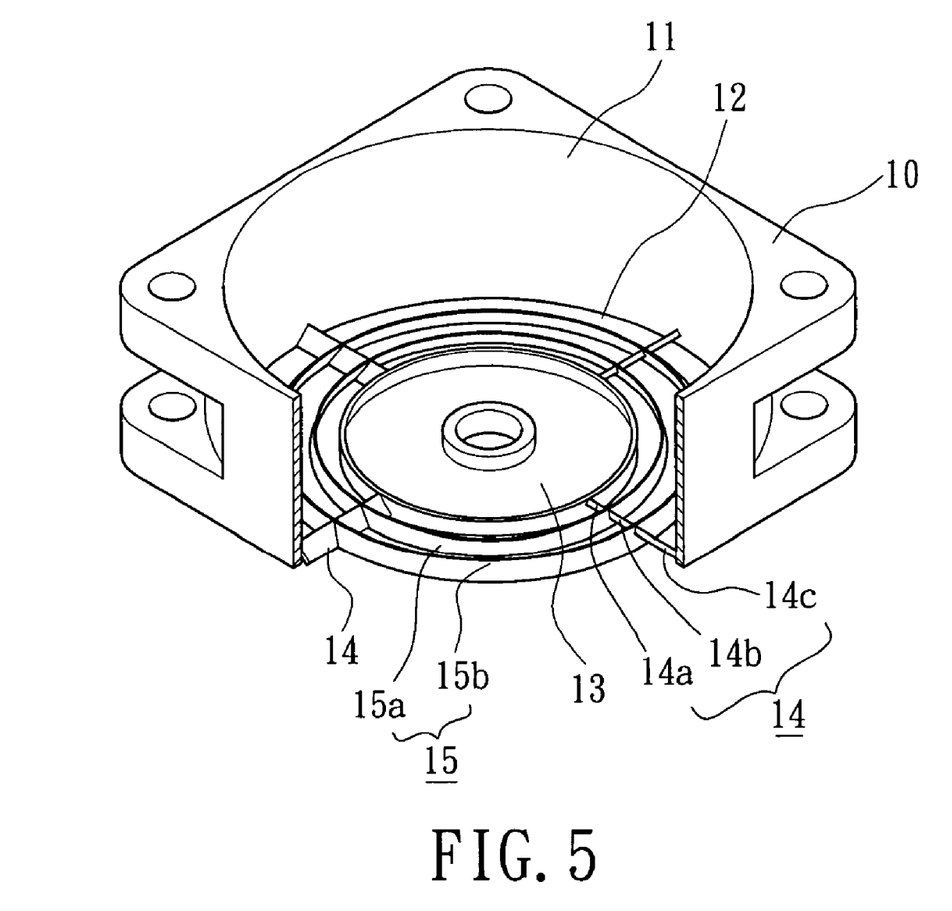
FIG. 5 is a perspective view, partly cutaway, of a heat-dissipating fan with a second embodiment of the airflow guiding structure varying in inclinations of air-guiding rings in accordance with the present invention.
Figure 6:
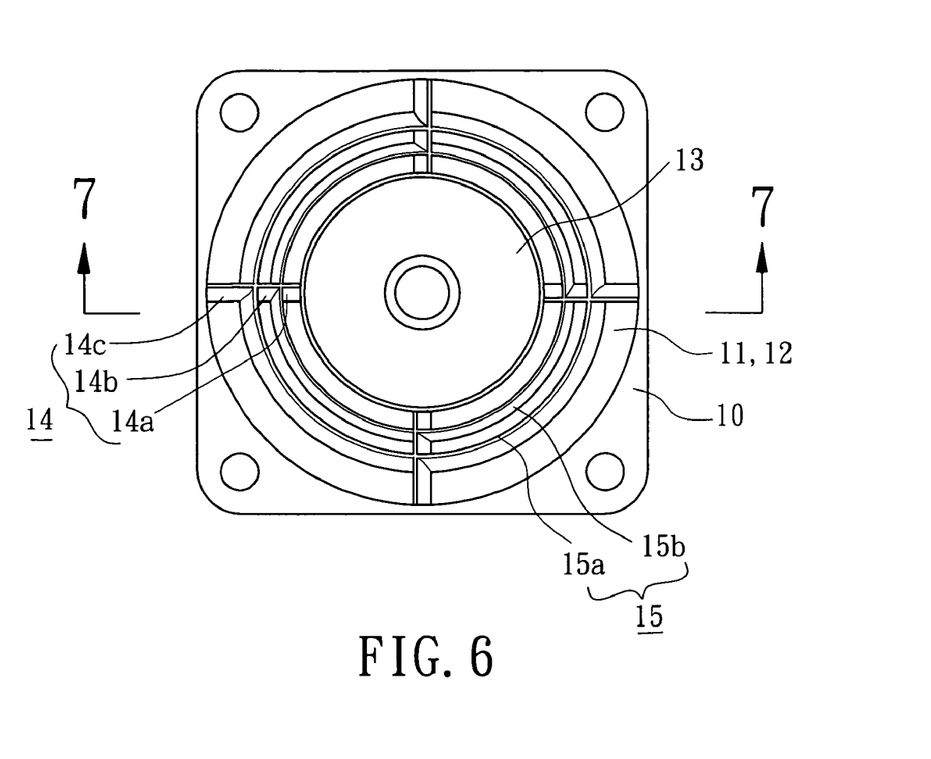
FIG. 6 is a top view of the heat-dissipating fan in FIG. 5.
Figure 7:
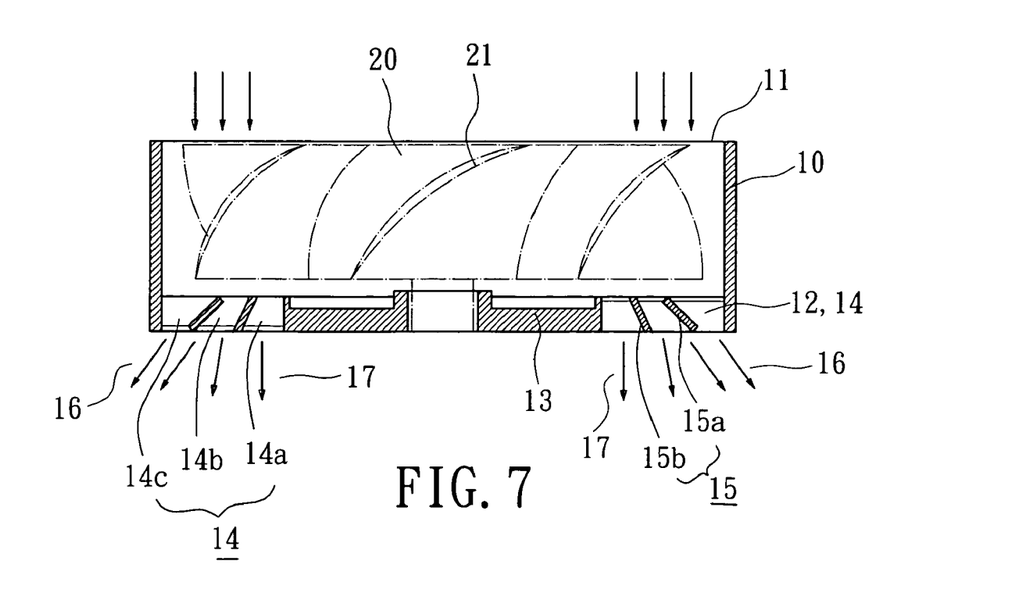
FIG. 7 is a sectional view taken along line 7-7 in FIG. 6.

FIGS. 5 through 7 illustrate a heat-dissipating fan with a second embodiment of the airflow guiding structure varying in inclinations of air-guiding rings in accordance with the present invention. In this embodiment, the air-guiding rings 15a, 15b extends downwardly (downstream) and radially outward away from the base 13, as best shown in FIG. 7. The air-guiding rings 15a, 15b vary in inclinations with respect to a longitudinal direction of the casing 10.

Still referring to FIG. 7, when the impeller turns 20, the blades 21 of the impeller 20 introduce airflow into the casing 10 via the air inlet 11 and expel the airflow via the air outlet 12, thereby dissipating heat from an object such as a heat sink or central processing unit (not shown). When the airflow passes through the air-guiding rings 15a, 15b and the ribs 14, the air-guiding rings 15a, 15b that varies in inclinations in a radially outward direction divides the airflow into an inner portion 17 adjacent to the base 13 and an outer portion 16 directed to an area outside the air outlet 12. Thus, the heat-dissipating fan can cool more area. Also, the heat-dissipating fan is suitable for installing within a limited space (e.g., in a notebook type computer or laptop computer), as the airflow can be guided to an object in a position not directly below the air outlet 12 or to an object having a relatively large size for more uniform heat dissipation. Thus, the air-guiding rings 15a, 15b provides an air-guiding effect.

Further, as illustrated in FIG. 7, following the inclining direction of the air-guiding rings 15a, 15b, varying in inclinations of the air-guiding rings 15a, 15b may increase the wind pressure in the air outlet 12. Further, since the wind pressure of the outer portion 16 of the airflow exiting the air outlet 12 is increased due to downward and radially outward inclination of the air-guiding rings 15a, 15b, the inner portion 17 of the airflow tends to flow radially inward, providing a concentration effect for the airflow for dissipating heat. The air flowing efficiency is thus improved.

Further, as illustrated in FIG. 5, the ribs 14 also provide an air-guiding effect when the ribs 14 incline along an air-driving direction of a plurality of blades 21 of the impeller 20. Meanwhile, the rib sections 14a, 14b and 14c of the ribs 14 separated by the air-guiding rings 15a, 15b may have different inclination angles according to the need.

Figure 8:
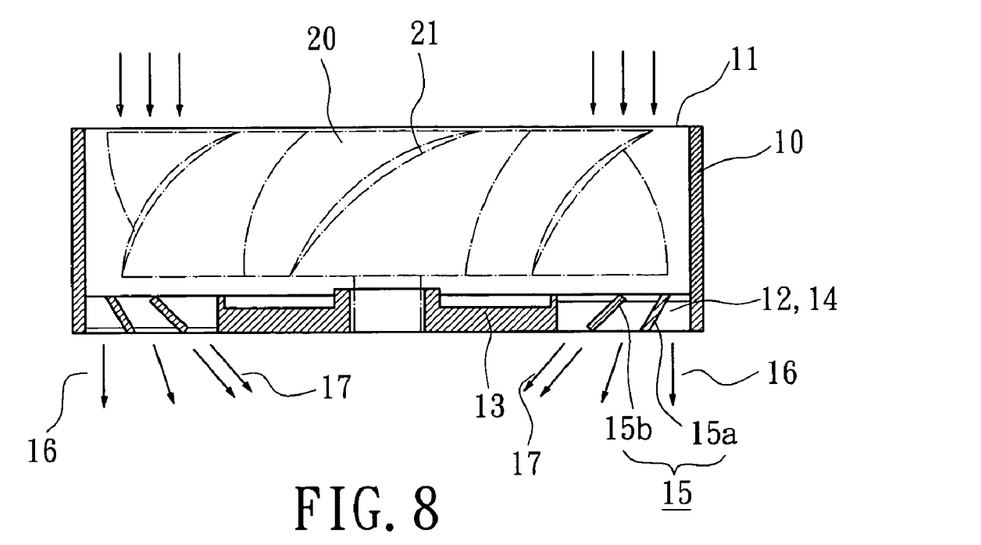
FIG. 8 is a sectional view similar to FIG. 7, illustrating a heat-dissipating fan with a third embodiment of the airflow guiding structure varying in inclinations of air-guiding rings in accordance with the present invention.

FIG. 8 illustrates a heat-dissipating fan with a third embodiment of the airflow guiding structure varying in inclinations of the air-guiding rings in accordance with the present invention. In this embodiment, the air-guiding rings 15a, 15b extends downward (downstream) and radially inward, and the air-guiding rings 15a, 15b vary in inclinations with respect to a longitudinal direction of the casing 10. Thus, an inner portion 17 of airflow is guided toward an object directly below the base 13, providing improved heat-dissipating efficiency. Following the inclining direction of the air-guiding rings 15a, 15b, varying in inclinations of the air-guiding rings 15a, 15b may increase the wind pressure in the air outlet 12. Further, since the wind pressure of the inner portion 17 of the airflow exiting the air outlet 12 is increased due to downward and radially inward inclination of the air-guiding rings 15a, 15b, the outer portion 16 of the airflow tends to flow radially inward, providing a concentration effect for the airflow for dissipating heat.

Figure 9:
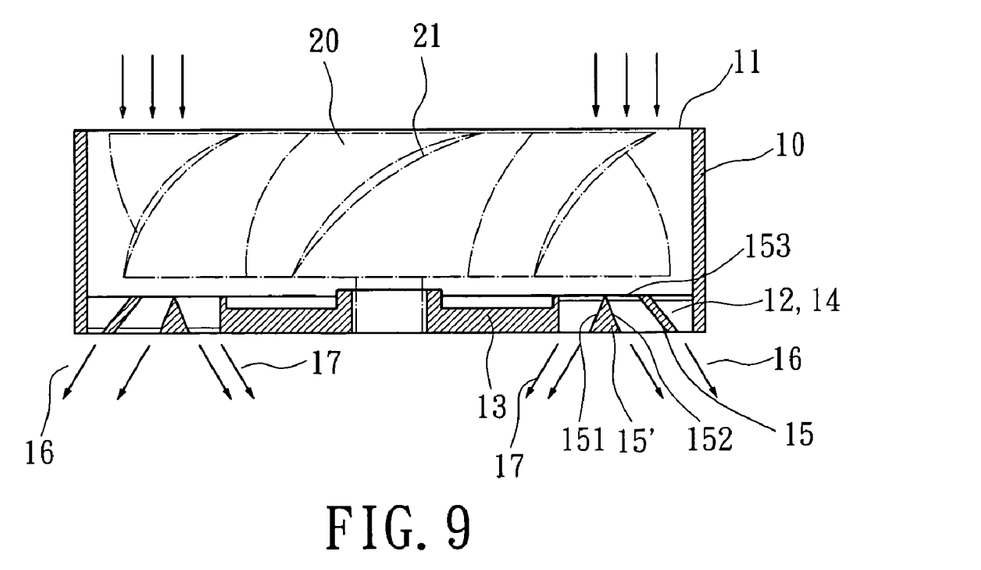
FIG. 9 is a sectional view similar to FIG. 7, illustrating a heat-dissipating fan with a fourth embodiment of the airflow guiding structure varying in inclinations of air-guiding rings in accordance with the present invention.

FIG. 9 illustrates a heat-dissipating fan with a fourth embodiment of the airflow guiding structure varying in inclinations of air-guiding rings in accordance with the present invention, wherein the air-guiding ring (now designated by 15') includes an annular inner face 151 extending downwardly and radially inward and an annular outer face 152 extending downwardly and radially outward. Preferably, the air-guiding ring 15' has a triangular section, with the annular inner face 151 and the annular outer face 152 connecting each other at a common annular ridge 153. By this arrangement, the airflow is divided by the air-guiding ring 15' into an inner portion 17 that is directed toward an area directly below the base 13 and an outer portion 16 that is directed toward an area outside the air outlet 12. The heat-dissipating area is thus increased, and the heat-dissipating efficiency of an object directly below the base 13 is improved. The air-guiding ring 15 has an inclination different from that of the annular outer face 152 of the air-guiding ring 15'. Further, following the inclining direction of the air-guiding rings 15, 15', varying in inclinations of the air-guiding rings 15, 15' may increase the wind pressure in the air outlet 12, as the sectional area in the air outlet side is decreased.

Figure 10:
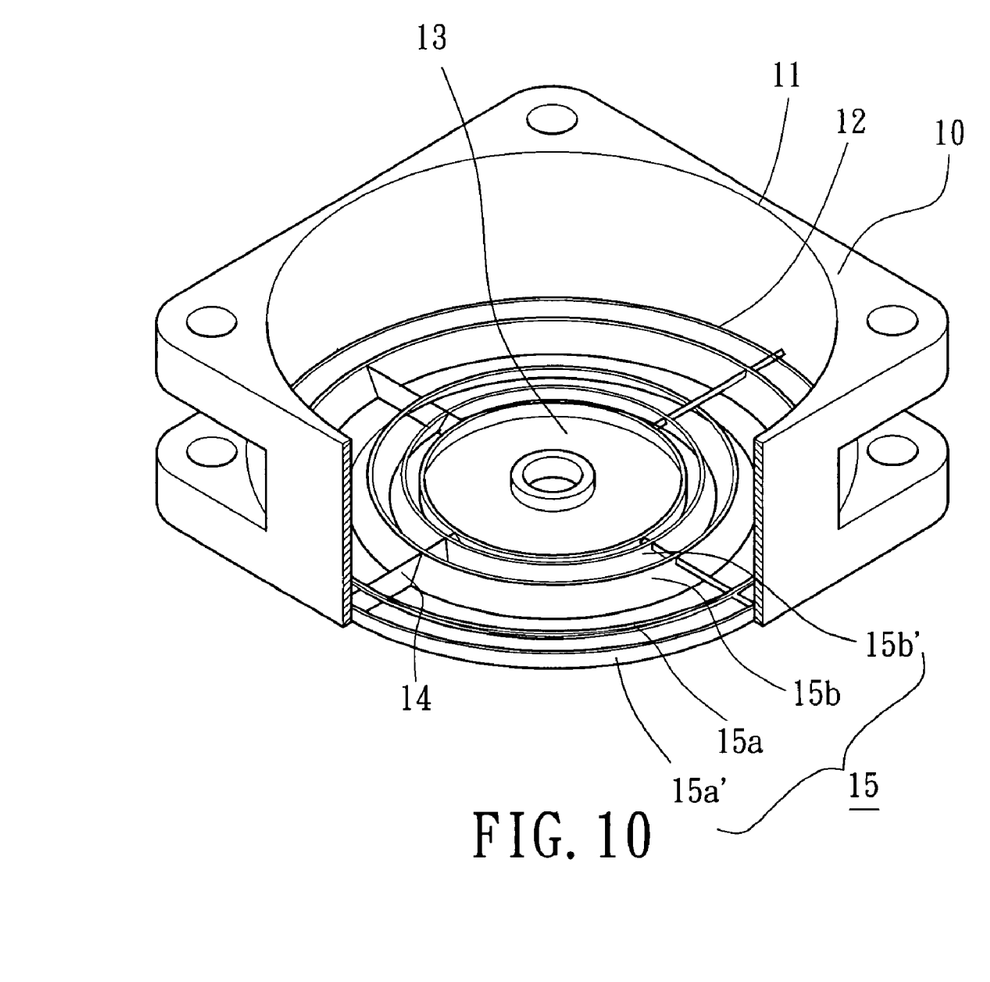
FIG. 10 is a perspective view, partly cutaway, of a heat-dissipating fan with a fifth embodiment of the airflow guiding structure varying in inclinations of air-guiding rings in accordance with the present invention.
Figure 11:
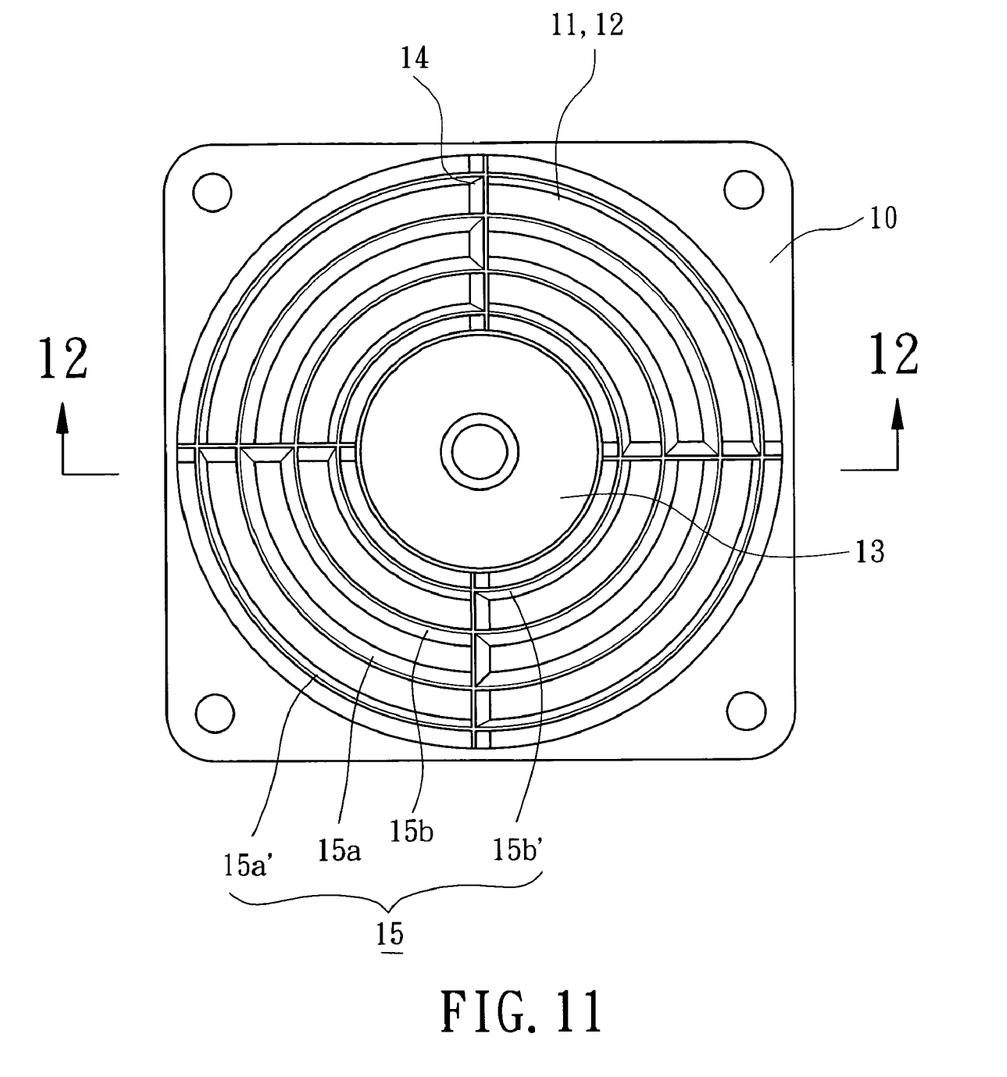
FIG. 11 is a top view of the heat-dissipating fan in FIG. 10.
Figure 12:
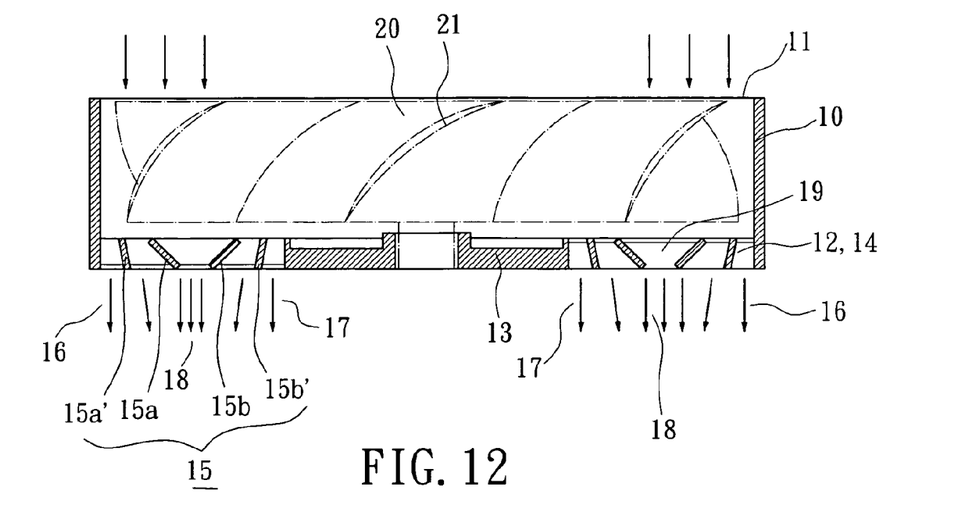
FIG. 12 is a sectional view taken along line 12-12 in FIG. 11.

FIGS. 10 through 12 illustrate a heat-dissipating fan with a fifth embodiment of the airflow guiding structure varying in inclinations of air-guiding rings in accordance with the present invention, wherein four air-guiding rings are provided. In particular, a pair of first air-guiding rings 15a, 15a' and a pair of second air-guiding rings 15b, 15b' are mounted between the base 13 and the casing 10 and extend across the ribs 14. Further, the second air-guiding rings 15b, 15b' are located between the base 13 and the first air-guiding rings 15a, 15a'.

The first air-guiding rings 15a, 15a' extend downward (downstream) and radially inward, and vary in inclinations along a longitudinal direction of the casing 10. Similarly, the second air-guiding rings 15b, 15b' extend downward and radially outward, and vary in inclinations along a longitudinal direction of the casing 10. A gap 19 is defined between a lower end of the first air-guiding ring 15a and a lower end of the second air-guiding ring 15b, as best shown in FIG. 12.

By this arrangement, an intermediate portion 18 of the airflow is guided to an area directly below the gap 19 between first and second air-guiding rings 15a, 15a', 15b and 15b' to concentrate the airflow and to improve the heat-dissipating effect of an object located in this area. Further, following the inclining directions of the first and second air-guiding rings 15a, 15a', 15b and 15b', varying in inclinations of the first air-guiding rings 15a, 15a' or the second air-guiding rings 15b, 15b' may increase the wind pressure in the air outlet 12. Further, since the wind pressure in the intermediate portion 18 of airflow is increased, an inner portion 17 of the airflow and an outer portion 16 of the airflow tend to flow toward the area directly below the gap 19 between the first air-guiding rings 15a, 15a' and the second air-guiding rings 15b, 15b', thereby dissipating heat with concentrated airflow.

Figure 13:
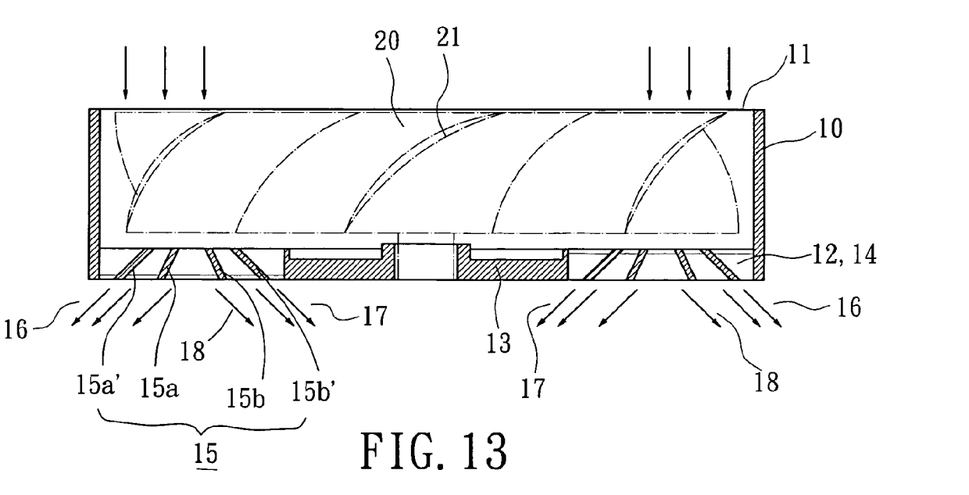
FIG. 13 is a sectional view similar to FIG. 12, illustrating a heat-dissipating fan with a sixth embodiment of the airflow guiding structure varying in inclinations of air-guiding rings in accordance with the present invention.

FIG. 13 illustrates a heat-dissipating fan with a sixth embodiment of the airflow guiding structure varying in inclination of air-guiding rings in accordance with the present invention modified from the fifth embodiment. In this embodiment, the first guiding rings 15a, 15a' extend downward (downstream) and radially outward, and vary in inclinations along a longitudinal direction of the casing 10. Similarly, the second guiding rings 15b, 15b' extend downward and radially inward, and vary in inclinations along a longitudinal direction of the casing 10.

By this arrangement, an inner portion 17 of the airflow is directed toward an area directly below the base 13, and an outer portion 16 of the airflow is directed toward an area outside the air outlet 12. The area subjected to heat-dissipating operation is increased. This arrangement is also applicable to a limited space for reliably guiding airflow to an object not directly located below the air outlet 12 and to an object having a relatively large size for more uniform heat dissipation. Further, following the inclining directions of the first and second air-guiding rings 15a, 15a', 15b and 15b', varying in inclinations of the first air-guiding rings 15a, 15a' or the second air-guiding rings 15b, 15b' may increase the wind pressure in the air outlet 12. Further, since the wind pressures of the inner portion 17 of the airflow and the outer portion 16 of the airflow are increased, the middle portion 18 of the airflow between the first air-guiding rings 15a, 15a' and second air-guiding rings 15b, 15b' tend to flow toward an area directly below the base 13 and an area outside the air outlet 12, providing concentrated airflow for heat dissipation.

Figure 14:
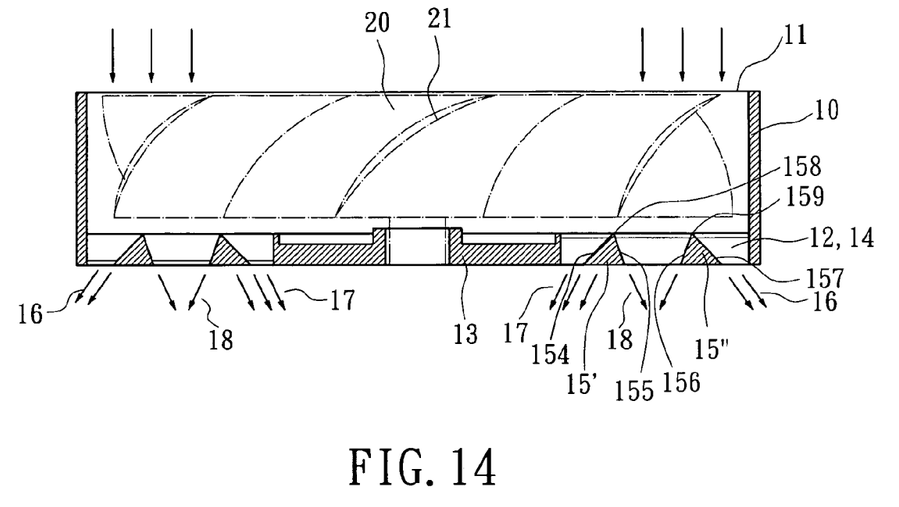
FIG. 14 is a sectional view similar to FIG. 12, illustrating a heat-dissipating fan with a seventh embodiment of the airflow guiding structure varying in inclinations of air-guiding rings in accordance with the present invention.

FIG. 14 illustrates a heat-dissipating fan with a seventh embodiment of the airflow guiding structure varying in inclination of air-guiding rings in accordance with the present invention. In this embodiment, the first air-guiding ring (now designated by 15') includes an annular inner face 154 extending downward (downstream) and radially inward and an annular outer face 155 extending downward and radially outward. Preferably, the first air-guiding ring 15' has a triangular section, with the annular inner face 154 and the annular outer face 155 connecting each other at a common annular ridge 158. Correspondingly, the second air-guiding ring (now designated by 15") includes an annular inner face 156 extending downward and radially inward and an annular outer face 157 extending downward and radially outward. The second air-guiding ring 15" has a triangular section, with the annular inner face 156 and the annular outer face 157 connecting each other at a common annular ridge 159. The annular inner faces 154, 156 of the first and second air-guiding rings 15', 15" vary in inclination along a longitudinal direction of the casing 10. Similarly, the annular outer faces 155, 157 of the first and second air-guiding rings 15', 15" vary in inclination along a longitudinal direction of the casing 10.

By this arrangement, the airflow is divided by the first and second air-guiding rings 15' and 15" into an inner portion 17 that is directed toward an area directly below the base 13, an intermediate portion 18 below an area between the first and second air-guiding rings 15' and 15", and an outer portion 16 that is directed toward an area outside the air outlet 12. The heat-dissipating area is thus increased. Further, following the inclining direction of the first and second air-guiding rings 15' and 15", varying in inclinations of the annular inner faces 154, 156 or the annular outer faces 155, 157 of the first and second air-guiding rings 15', 15" may increase the wind pressure in the air outlet 12, as the sectional area in the air outlet side is decreased.

Further, as illustrated in FIGS. 2 through 14, the direction of the airflow can be guided by means of at least two air-guiding rings follows from the number, the inclining direction and the inclining angle of the air-guiding ring(s) in response to the size, location, and shape of the blades 21 of the impeller 20 and of the object (such as a heat sink) to be dissipated as well as the amount of heat to be dissipated.

While the principles of this invention have been disclosed in connection with specific embodiments, it should be understood by those skilled in the art that these descriptions are not intended to limit the scope of the invention, and that any modification and variation without departing the spirit of the invention is intended to be covered by the scope of this invention defined only by the appended claims.

What is claimed is:

1. A heat-dissipating fan comprising:
a casing having an air outlet;
a base mounted in the air outlet, an impeller being adapted to be mounted on the base and having a plurality of blades;
a plurality of ribs each extending between the base and the casing along a radial direction of the base; and
at least two air-guiding rings co-axially arranged and fixedly mounted to the ribs, wherein one of said air-guiding rings includes an annular inner face extending downstream and radially inward, and an annular outer face extending downstream and radially outward.

2. The heat-dissipating fan as claimed in claim 1, wherein one of said air-guiding rings extends in a direction parallel to a longitudinal direction of the casing.

3. The heat-dissipating fan as claimed in claim 1, wherein one of said air-guiding rings extends downstream and radially outward.

4. The heat-dissipating fan as claimed in claim 1, wherein one of said air-guiding rings extends downstream and radially inward.

5. The heat-dissipating fan as claimed in claim 1, wherein said air-guiding ring with an annular inner face extending downstream and radially inward and an annular outer face extending downstream and radially outward has a triangular section, and the annular inner face and the annular outer face connecting each other at a common annular ridge.

6. A heat-dissipating fan comprising:
a casing having an air outlet;
a base mounted in the air outlet, an impeller being adapted to be mounted on the base and having a plurality of blades;
a plurality of ribs each extending between the base and the casing along a radial direction of the base;
at least one first air-guiding ring fixedly mounted to the ribs and located between the base and the casing, said first air-guiding ring including an annular inner face extending downstream and radially inward, and an outer face extending downstream and radially outward; and
at least one second air-guiding ring fixedly mounted to the ribs and located between the first guiding ring and the casing, said second air-guiding ring including an annular inner face extending downstream and radially inward, and an annular outer face extending downstream and radially outward,
wherein said annular inner faces of the first and second air-guiding rings vary in inclinations along a longitudinal direction of the casing; and said annular outer faces of the first and second air-guiding rings vary in inclinations along a longitudinal direction of the casing.

7. The heat-dissipating fan as claimed in claim 6, wherein one of said first air-guiding rings has a triangular section, and the annular inner face and the annular outer face of said first air-guiding ring connect with each other at a common annular ridge.

8. The heat-dissipating fan as claimed in claim 6, wherein one of said second air-guiding rings has a triangular section, and the annular inner face and the annular outer face of said second air-guiding ring connect with each other at a common annular ridge.

9. The heat-dissipating fan as claimed in claim 6, wherein the ribs incline along an air-driving direction of the blades of the impeller.

10. The heat-dissipating fan as claimed in claim 6, wherein each of said ribs has rib sections separated by said first and second air-guiding rings, and said rib sections have different inclining angles.

* * * * *